United States Patent [19]

Iijima et al.

[11] Patent Number: 4,954,803

[45] Date of Patent: Sep. 4, 1990

[54] MAGNETIC-RESISTOR SENSOR AND A MAGNETIC ENCODER USING SUCH A SENSOR

[75] Inventors: Kenzaburou Iijima; Yoshinori Hayashi, both of Shizuoka, Japan

[73] Assignee: Yamaha Corporation, Japan

[21] Appl. No.: 324,391

[22] Filed: Mar. 15, 1989

[30] Foreign Application Priority Data

Mar. 18, 1988 [JP] Japan .................................. 63-65379
Apr. 26, 1988 [JP] Japan ................................. 63-102902

[51] Int. Cl.[5] ............................................ H01L 43/00
[52] U.S. Cl. .................................................. 338/32 R
[58] Field of Search ............. 338/32 R; 360/113, 124; 324/252

[56] References Cited

U.S. PATENT DOCUMENTS 4,184,631  1/1980  Lazzari ........................... 360/113 X
4,418,372 11/1983  Hayashida et al. ................. 360/113
4,639,807  1/1987  Sekizawa et al. ................... 360/113
4,649,447  3/1987  Huang et al. .................... 360/113 X

FOREIGN PATENT DOCUMENTS 62-162215  7/1987  Japan .................................. 360/113

Primary Examiner—
Assistant Examiner—Marvin M. Lateef
Attorney, Agent, or Firm—Ostrolenk, Faber, Gerb & Soffen

[57] ABSTRACT

A magnetic-resistor sensor is provided with two or more comb-like patterns of different pitches formed on a single base plate and each comb-like pattern is adapted for use in combination with a magnetic scale of a corresponding information pitch so that one magnetic-resistor sensor could span magnetic scales of different information pitches. Such a universal magnetic-resistor sensor is used for a magnetic encoder having a magnetic scale in which a magnetic information pattern and a reference position pattern are formed in the same single track, thereby conserving space on the magnetic scale.

6 Claims, 3 Drawing Sheets

MAGNETIC-RESISTOR SENSOR AND A MAGNETIC ENCODER USING SUCH A SENSOR

BACKGROUND OF THE INVENTION

The present invention relates to a magnetic resistor sensor and a magnetic encoder using such a sensor, and more particularly relates to improvements in universality and structural simplicity of a magnetic encode used for detection of various displacements in automatic devices such as industrial robots.

A magnetic-resistor is in general made up of a magnetic scale coupled to a mobile object and one or more magnetic sensors combined with each other for relative sensing displacement of the object.

The magnetic scale includes a magnetic information pattern magnetized on a magnetic medium along an elongated track. Most commonly, the magnetic medium is circular in shape, the track is annular and the magnetic information pattern is given in the form of sine waves of a prescribed pitch, i.e. a prescribed wave length ($\lambda$).

The magnetic sensor usually takes the form of a magnetic-resistor sensor made of a material which changes its inherent resistance depending upon the intensity of the magnetic field applied thereto. The magnetic-resistor sensor has a comb-like pattern which is formed on a base plate and made up of a plurality of sensor sections and a plurality of connector sections each intervening between adjacent sensor sections. The sensor sections run normal to the direction of relative displacement and the connector sections run parallel to the direction of relative displacement between the magnetic scale and the magnetic sensor. The sensor sections are spaced from each other in the direction of relative displacement depending on the above-described pitch of the magnetic information pattern stored on the magnetic scale.

As the relative displacement advances, the magnetic information pattern on the magnetic scale is detected by the magnetic sensor which in turn generates corresponding output signals.

As stated above, a magnetic resistor sensor takes the form of a comb-like pattern formed on a base plate in which sensor sections are spaced from each other depending on the pitch of a magnetic information pattern stored on a counterpart magnetic scale. Thus, a magnetic-resistor sensor of a specified sensor section pitch can be used only for a magnetic scale of a corresponding magnetic-resistor sensor is unusable for a magnetic scale of a different magnetic information pattern pitch. Thus, most conventional magnetic resistor sensors are have in poor universatility.

In detection of a displacement of a mobile object by a magnetic encoder, a magnetic information pattern stored on a magnetic scale is sequentially detected by an associated magnetic-resistor sensor (or sensors) during a relative displacement and the magnetic encoder generates absolute position data indicative of the amount of displacement of the mobile object. Each absolute position datum is usually made up of first and second fractions. The first fraction indicates the current number of magnetic domains on the magnetic scale which have been passed by the magnetic resistor sensor, the second fraction indicates the current position of the magnetic-resistor sensor in a particular magnetic domain on the magnetic scale. The magnetic encoder is provided with an electric circuit which processes output signals from the magnetic-resistor sensor for generation of the first and second fractions of the absolute position data. Such as electric circuit includes a counter which must be reset every time a border between adjacent magnetic domains on the magnetic scale is passed by the magnetic-resistor sensor during the relative displacement. To this end, the magnetic scale needs to include, in addition to a first track for storing the magnetic information pattern, a second track for storing a magnetic reference position pattern which shows the borders between adjacent magnetic domains. Use of such an additional track requires an increased size of the magnetic scale and provision of an additional magnetic-resistor sensor for detecting such a magnetic reference position pattern on the magnetic scale.

SUMMARY OF THE INVENTION

It is a main object of the present invention to provide a magnetic-resistor sensor usable for magnetic scales of various magnetic information pattern pitches.

It is another object of the present invention to provide a magnetic encoder with a reduced size and a simplified construction.

In accordance with a first aspect of the present invention a plurality of juxtaposed comb-like patterns of a magnetic-resistor sensor are formed on a base plate. Each comb-like pattern includes (i) a plurality of juxtaposed sensor sections spaced from each other by a distance that is fixed depending on the pitch of a magnetic information pattern stored on a magnetic scale and (ii) a plurality of connector sections intervening between the sensor sections; the mentioned distance being different from magnetic scale to magnetic scale usable in combination with the magnetic-resistor sensor.

In accordance with a second aspect of the present invention, a magnetic scale of a magnetic encoder includes (i) a magnetic information pattern magnetized along a track on a magnetic recording medium and (ii) a magnetic reference position pattern magnetized at selected positions in the track. A magnetic resistor-sensor of the magnetic encoder is arranged facing the magnetic scale and includes the first and second juxtaposed comb-like patterns. The first comb-like pattern includes (i) a plurality of juxtaposed sensor sections spaced from each other by a distance that is fixed depending on the pitch of the magnetic information pattern on the magnetic scale and (ii) a plurality of connector sections intervening between the sensor sections. The second comb-like pattern includes (i) a plurality of juxtaposed sensor sections spaced from each other by a distance that is fixed depending on the pitch of the magnetic reference position pattern on the magnetic scale and (ii) a plurality of connector sections intervening between the sensor sections.

DESCRIPTION OF THE PREFERRED EMBODIMENTS

Figure 1:
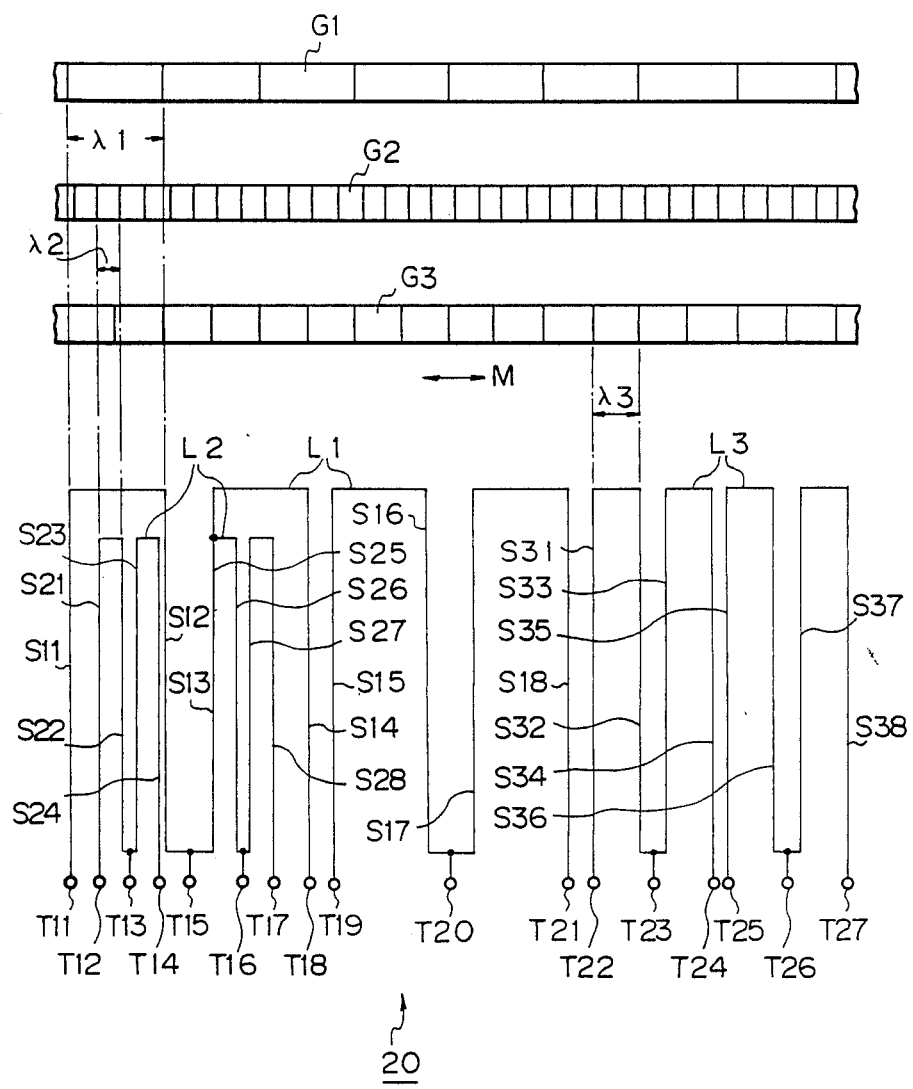
FIG. 1 is a schematic view of one embodiment of the magnetic-resistor sensor in accordance with the first aspect of the present invention.

One embodiment of the magnetic-resistor sensor in accordance with a first aspect of the present invention is shown in FIG. 1. In this case, the magnetic-resistor sensor 20 is usable in combination with three magnetic scales G1, G2 and G3 storing magnetic information patterns of different pitches $\lambda 1$, $\lambda 2$ and $\lambda 3$, $\lambda$ being the wave length of a magnetized sine wave. The magnetic-resistor sensor 20 includes three different comb-like patterns L1, L2 and L3.

The first comb-like pattern L1 corresponds to the first magnetic scale G1 and includes eight sensor sections S11 to S18. The second comb-like pattern L2 corresponds to the second magnetic scale G2 and includes eight sensor sections S21 to S28. The third comb-like pattern L3 corresponds to the third magnetic scale G3 and includes eight sensor sections S31 to S38. The sensor sections S11 and S38 all extend in directions substantially normal to the direction of relative displacement M.

The sensor sections S11 to S18 are arranged corresponding to the pitch of magnetic information pattern $\lambda 1$ on the first magnetic scale G1. More specifically, the sensor section S12 is spaced from the sensor section S11 by a distance $\lambda 1$, the sensor section S13 is spaced from the sensor section S12 by a distance $\lambda \frac{1}{2}$, the sensor section S14 is spaced from the sensor section S13 by a distance $\lambda 1$, the sensor section 14 S15 is spaced from the sensor section by a distance $(m+\frac{1}{4})\lambda 1$ where m is an integer, the sensor section S16 is spaced from the sensor section S15 by a distance $\lambda 1$, the sensor section S17 is spaced from the sensor section S16 by a distance $\lambda \frac{1}{2}$, and the sensor section S18 is spaced from the sensor section S17 by a distance $\lambda 1$.

The sensor sections S21 to S28 are arranged with similar spacing corresponding to the pitch of magnetic information pattern $\lambda 2$ on the second magnetic scale G2, and the sensor sections S31 to S38 are also arranged with similar spacing corresponding to the pitch of magnetic information pattern $\lambda 3$ on the third magnetic scale G3. Ends of the sensor sections S11 to S18, S21 to S28 and S31 to S38 are provided with terminals T11 to T27.

When the magnetic-resistor sensor 20 is used in combination with the first magnetic scale G1, the first comb-like pattern L1 operates. The terminals T18 and T19 are earthed and a source voltage+Vcc is applied to between the terminals T11 and T21. As the relative displacement advances, sine wave detection signals are generated at the terminal T15 and cosine wave detection signals are generated at the terminal T20. The amount and direction of the relative displacement between the magnetic sensor 20 and the first magnetic scale G1 are known on the basis of these detection signals.

When the magnetic-resistor sensor 20 is used in combination with the second magnetic scale G2, the second comb-like pattern L2 operates. The terminals T14 and T15 are earthed and a source voltage+Vcc is applied to between the terminals T12 and T17. As the relative displacement advances, sine wave detection signals are generated at the terminal T13 and cosine wave detection signals are generated at the terminal T16. The amount and direction of the relative displacement between the magnetic-resistor sensor 20 and the second magnetic scale G2 are known on the basis of these detection signals.

When the magnetic-resistor sensor 20 is used in combination with the third magnetic scale G3, the third comb-like pattern L3 operates. The terminals T24 and T25 are earthed and a source voltage+Vcc is applied to between the terminals T22 and T27. As the relative displacement advances, sine wave detection signals are generated at the terminal T23 and cosine wave detection signals are generated at the terminal T26. The amount and direction of the relative displacement between the magnetic-resistor sensor 20 and the third magnetic scale G3 are known on the basis of these detection signals.

As is clear from the foregoing description, the magnetic-resistor sensor in accordance with the first aspect of the present invention is usable for two or more magnetic scales of different pitches of magnetic information pattern.

Figure 2:
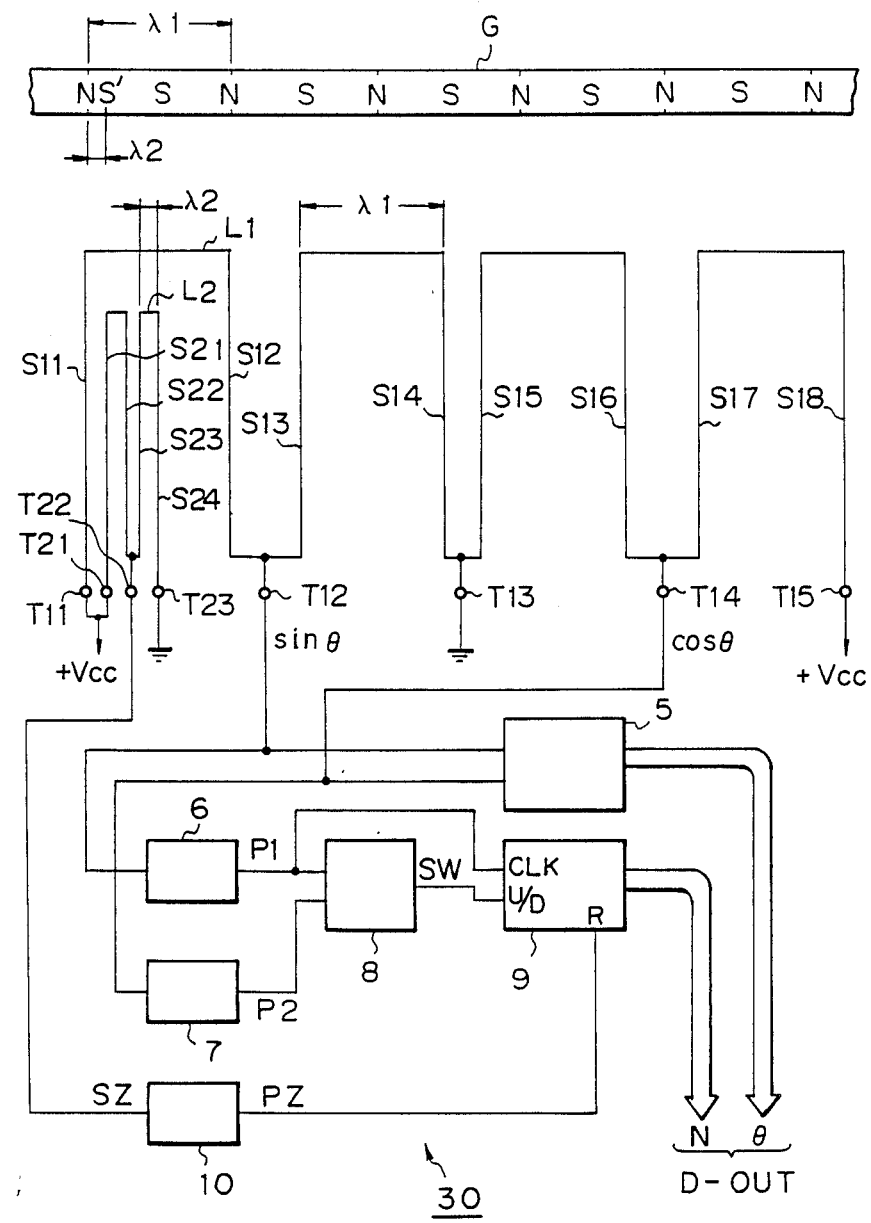
FIG. 2 is a schematic view of one embodiment of the magnetic encoder in accordance with the second aspect of the present invention.

One embodiment of the magnetic encoder in accordance with the second aspect of the present invention is shown in FIG. 2 in which a magnetic-resistor sensor 30 is used in combination with a magnetic scale G.

The magnetic scale G includes a magnetic information pattern which is made up of sine waves of a pitch $\lambda 1$ magnetized along a given track. At a position of a distance $\lambda 2$ from a magnetic pole N is formed a magnetic pole S' in one magnetic domain of the magnetic information pattern in the track in order to form a magnetic reference position pattern.

The magnetic-resistor sensor 30 includes two different comb-like pattern L1 and L2. The first comb-like pattern L1 corresponds to the magnetic information pattern on the magnetic scale G and include eight sensor sections S11 to S18. The second comb-like pattern L2 corresponds to the magnetic reference position pattern and includes four sensor sections S21 to S24.

The sensor sections S11 to S18 are arranged corresponding to the pitch of magnetic information pattern $\lambda 1$ on the magnetic scale G. More specifically, the sensor section S12 is spaced from the sensor section S11 by a distance $\lambda 1$, the sensor section S13 is spaced from the sensor section S12 by a distance $\lambda \frac{1}{2}$, the sensor section S14 is spaced from the sensor section S13 by a distance $\lambda 1$, the sensor section S15 is spaced from the sensor section S14 by a distance $\lambda \frac{1}{4}$, the sensor section S16 is spaced from the sensor section S15 by a distance $\lambda 1$, the sensor section S17 is spaced from the sensor section S16 by a distance $\lambda \frac{1}{2}$, and the sensor section S18 is spaced from the sensor section S17 by a distance $\lambda 1$.

The sensor sections S21 to S24 are arranged corresponding to the pitch of magnetic reference position pattern $\lambda 2$ on the magnetic scale G. More specifically, the sensor section S21 is spaced from the sensor section S11 of the first comb-like pattern L1 by a distance $\lambda 2$, the sensor section S22 is spaced from the sensor section S21 by a distance $\lambda 2$, the sensor sections S23 is spaced from the sensor section S22 by a distance $\lambda 2/2$, and the sensor section S24 is spaced from the sensor section S24 by a distance $\lambda 2$. Ends of the sensor sections S11 to S18 and S21 to S24 are provided with terminals T11 to T15 and T21 to T23.

The terminals T13 and T23 are earthed and a source voltage+Vcc is applied to the terminals T11, T15 and T21. The terminal T14 generates pitch signals and the terminal T22 generates reference position signals. The terminals T12, T14 and T22 is connected to an electric circuit.

The electric circuit includes an angle detector 5 connected to the terminals T12 and T14. The terminal T12 is further connected to the first wave shape rectifier 6 whereas the terminal T14 is further connected to the second wave shape rectifier 7 of the electric circuit. Further, the terminal T22 is connected to the third wave shape rectifier 10 of the electric circuit. The first wave shape rectifier 6 is connected on one hand to clock terminal CLK of an up-down counter 9 and on the other hand to one input terminal of a direction discriminator 8. The second wave shape rectifier 7 is connected to the other input terminal of the direction discriminator 8 which in turn connected to the up-down terminal U/D of the counter 9. The terminal T22 is connected to the reset terminal R of the counter 9 via the third wave shape rectifier 10.

Figure 3:
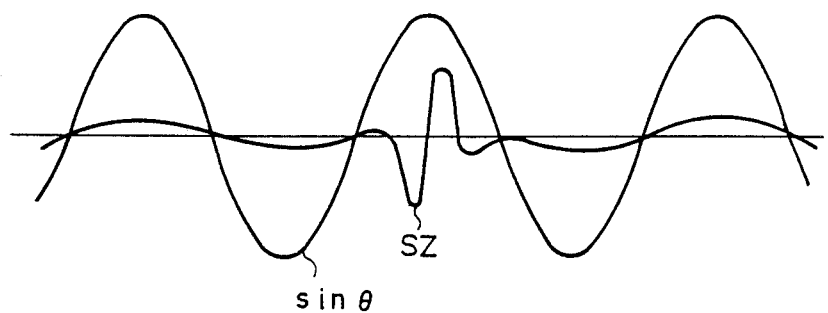
FIG. 3 is a wave shape diagram of detection signals issued by the magnetic-resistor sensor of the magnetic encoder.

As the relative displacement starts, the terminals T12 and T14 issue pitch signal $\sin\theta$ and $\cos\theta$ corresponding to a current amount of relative displacement. The wave shape of the pitch signal $\sin\theta$ is shown in FIG. 3. On receipt of these pitch signals $\sin\theta$ and $\cos\theta$, the angle detector 5 issues an angle signal $\theta$. Concurrently, the number of magnetic domains on the magnetic scale G passed by the magnetic-resistor sensor 30 is counted by the counter 9. Since the second comb-like pattern L2 is located outside the magnetic field generated by the magnetic information pattern on the magnetic scale G and, as a consequence, output signals issued by the terminal T21 is very small in amplitude when the magnetic-resistor sensor 30 does not face the reference position on the magnetic scale G. However, the terminal T21 issues a reference position signal SZ of a large amplitude when the reference position is passed by the magnetic-resistor sensor 30. This reference position signal SZ resets the counter 9. The counter 9 issues a count signal N indicative of the number of magnetic domains passed by the magnetic-resistor sensor 30. As stated already, the count signal N forms the first fraction and the angle signal $\theta$ forms the second fraction of each absolute position datum D-OUT.

Figure 4:
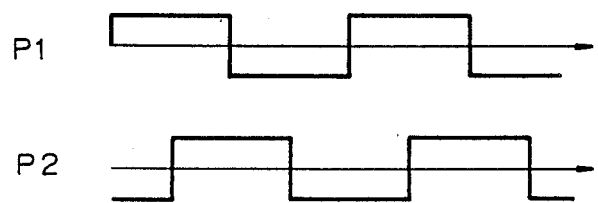
FIG. 4 is a graph for showing signals processed in the electric circuit of the magnetic encoder shown in FIG. 2.

Output signals P1 and P2 issued by the wave shape rectifiers 6 and 7 are shown in FIG. 4

As is clear from the foregoing description, magnetic information and reference position patterns are included in a single track on a magnetic scale and a single magnetic-resistor sensor can span these two magnetic patterns of different pitches.

Although the present invention has been described in relation to particular embodiments thereof, many other variations and modifications and other uses will become apparent to those skilled in the art. It is preferred, therefore, that the present invention be defined not by the specific disclosure herein, but only by the appended claims.

We claim:

1. An improved magnetic-resistor sensor, comprising:
   a base; and
   a plurality of juxtaposed comb-like patterns formed on said base plate;
   each said comb-like pattern including a plurality of juxtaposed sensor sections spaced from each other by a distance fixed depending on the pitch of a respective magnetic information pattern stored on a magnetic scale, usable in combination with said resistor sensor and a plurality of connector portions intervening between said sensor sections; and said distance being different from pattern to pattern.

2. An improved magnetic-resistor sensor as claimed in claim 1, in which said comb-like patterns are spaced from each other in the direction of relative displacement between said resistor sensor and said magnetic scale.

3. An improved magnetic-resistor sensor as claimed in claim 2, in which said sensor sections are spaced from each other in said direction of relative displacement.

4. An improved magnetic-resistor sensor as claimed in claim 2, in which said sensor sections extend substantially normal to said direction of relative movement.

5. A magnetic encoder, comprising:
   a magnetic scale including a magnetic information pattern magnetized along a track on a magnetic recording medium and a magnetic reference position pattern magnetized at selected positions in said track; and
   a magnetic sensor arranged facing said magnetic scale for sensing relative displacement and including first and second juxtaposed comb-like patterns;
   said first comb-like pattern including a plurality of juxtaposed sensor sections spaced from each other by a distance fixed depending on the pitch of said magnetic information pattern on said magnetic scale, and a plurality of connector portions intervening between said sensor sections; and said second comb-like pattern including a plurality of juxtaposed sensor sections spaced from each other by a distance fixed depending on the pitch of said magnetic reference position pattern on said magnetic scale, and a plurality of connector portions intervening between said sensor sections.

6. A magnetic encoder, comprising:
   a magnetic scale including:
   (i) a magnetic information pattern magnetized along a track on a magnetic recording medium; and
   (ii) a magnetic reference position pattern magnetized at selected positions in said track; and
   magnetic sensor means arranged to face said magnetic scale for sensing relative displacement and including a pair of comb-like patterns each having a plurality of juxtaposed sensor sections spaced from each other by a respective distance that respectively corresponds to the respective pitches of said magnetic scale and of said magnetic reference position pattern on said magnetic scale.

* * * * *